United States Patent
Setoyama et al.

[11] Patent Number: 5,478,634
[45] Date of Patent: Dec. 26, 1995

[54] ULTRA-THIN FILM LAMINATE

[75] Inventors: Makoto Setoyama; Motoyuki Tanaka; Akira Nakayama; Takashi Yoshida; Yasuhisa Hashimoto; Kazuo Yamagata; Mitsunori Kobayashi, all of Itami, Japan

[73] Assignee: Sumitomo Electric Industries, Ltd., Osaka, Japan

[21] Appl. No.: 447,906

[22] Filed: May 23, 1995

Related U.S. Application Data

[62] Division of Ser. No. 134,692, Oct. 12, 1993.

[30] Foreign Application Priority Data

Oct. 12, 1992 [JP] Japan .................... 4-272946
Dec. 25, 1992 [JP] Japan .................... 4-346655
Apr. 22, 1993 [JP] Japan .................... 5-95940

[51] Int. Cl.$^6$ ............................ B23C 14/06; B32B 15/04
[52] U.S. Cl. ........................ 428/216; 51/295; 51/307; 51/309; 428/212; 428/697; 428/698; 428/699; 428/204
[58] Field of Search ........................ 428/698, 699, 428/697, 212, 216, 704; 51/295, 307, 309

[56] References Cited

U.S. PATENT DOCUMENTS

| | | | |
|---|---|---|---|
| 4,554,201 | 11/1985 | Andreev et al. | 428/699 |
| 4,643,951 | 2/1987 | Keen et al. | 428/698 |
| 4,686,156 | 8/1987 | Baldoni, III et al. | 428/698 |
| 4,714,660 | 12/1987 | Gates, Jr. | 428/699 |
| 4,753,854 | 6/1988 | Gavrilov et al. | 428/697 |
| 4,776,863 | 10/1988 | Van den Berg et al. | 428/698 |
| 4,835,062 | 5/1989 | Holleck | 428/698 |
| 4,895,770 | 1/1990 | Schintlmeister et al. | 428/698 |
| 4,984,940 | 1/1991 | Bryant et al. | 428/698 |
| 5,071,693 | 10/1991 | Sue et al. | 428/212 |
| 5,075,181 | 12/1991 | Quinto et al. | 428/212 |

FOREIGN PATENT DOCUMENTS

| | | |
|---|---|---|
| 01626565 | 11/1985 | European Pat. Off. . |
| 3532733 | 6/1986 | Germany . |
| 61-235555 | 10/1986 | Japan . |

OTHER PUBLICATIONS

J. Vac. Sci. Technol. A, vol. 3, No. 6, Nov./Dec. 1985, pp. 2345–2347, H. Holleck, "Wear resistant carbideboride composite coatings".

J. Vac. Sci. Technol. A, vol. 4, No. 6, Nov./Dec. 1986, pp. 2661–2669, H. Holleck, "Material selection for hard coatings".

High Tech Ceramics, 1987, Amsterdam, Neth., pp. 2609–2622, H. Holleck, "Significance of Phase Boundaries in Wear Resistant TiC/TiB$_2$ Materials".

Surface and Coatings Technology, 36 (1988) pp. 707–714, H. Holleck, "Preparation and behaviour of wear resistant TiC/TiB$_2$, TiN/TiB$_2$ and Ti/TiN coatings with high amounts of phase boundaries".

(List continued on next page.)

*Primary Examiner*—Archene Turner
*Attorney, Agent, or Firm*—Wenderoth, Lind & Ponack

[57] ABSTRACT

A coating film which can sufficiently improve the wear resistance of a cutting tool or a wear-resistant tool and which reveals excellent qualities as a wear-resistant or protective film for an electric or electronic part or a sliding or machine part. Such a coating film is in the form of an ultra-thin film laminate comprising at least one nitride or carbonitride of at least one element selected from the group consisting of the elements in the groups IVa, Va and VIa in the periodic table and Al and B and having a cubic crystal structure and having mainly metallic bonding properties, and at least one compound having a crystal structure other than the cubic crystal structure at normal temperature and normal pressure and under equilibrium state and having mainly covalent bonding properties, the at least one nitride or carbonitride and the compound being alternately laminated in the form of layers, each layer of the compound having a thickness of 0.2–50 nm, the laminate having a cubic crystalline X-ray diffraction pattern as a whole.

9 Claims, 4 Drawing Sheets

OTHER PUBLICATIONS

Surface and Coatings Technology, 41 (1990) pp. 179–190; H. Holleck, "Multilayer coatings—influence of fabrication parameters on constitution and properties".

Surface Engineering 1991, vol. 7, No. 2, pp. 137–144, H. Holleck, "Designing advanced coatings for wear protection".

Wear, 165 (1993) pp. 85–95, C. Subramanian, "Review of multicomponent and multilayer coatings for tribological applications".

J. Vac. Sci. Technol. A 10(4), Jul./Aug. 1992, pp. 1604–1609, X. Chu, "Deposition and properties of polycrystalline TiN/NbN superlattice coatings".

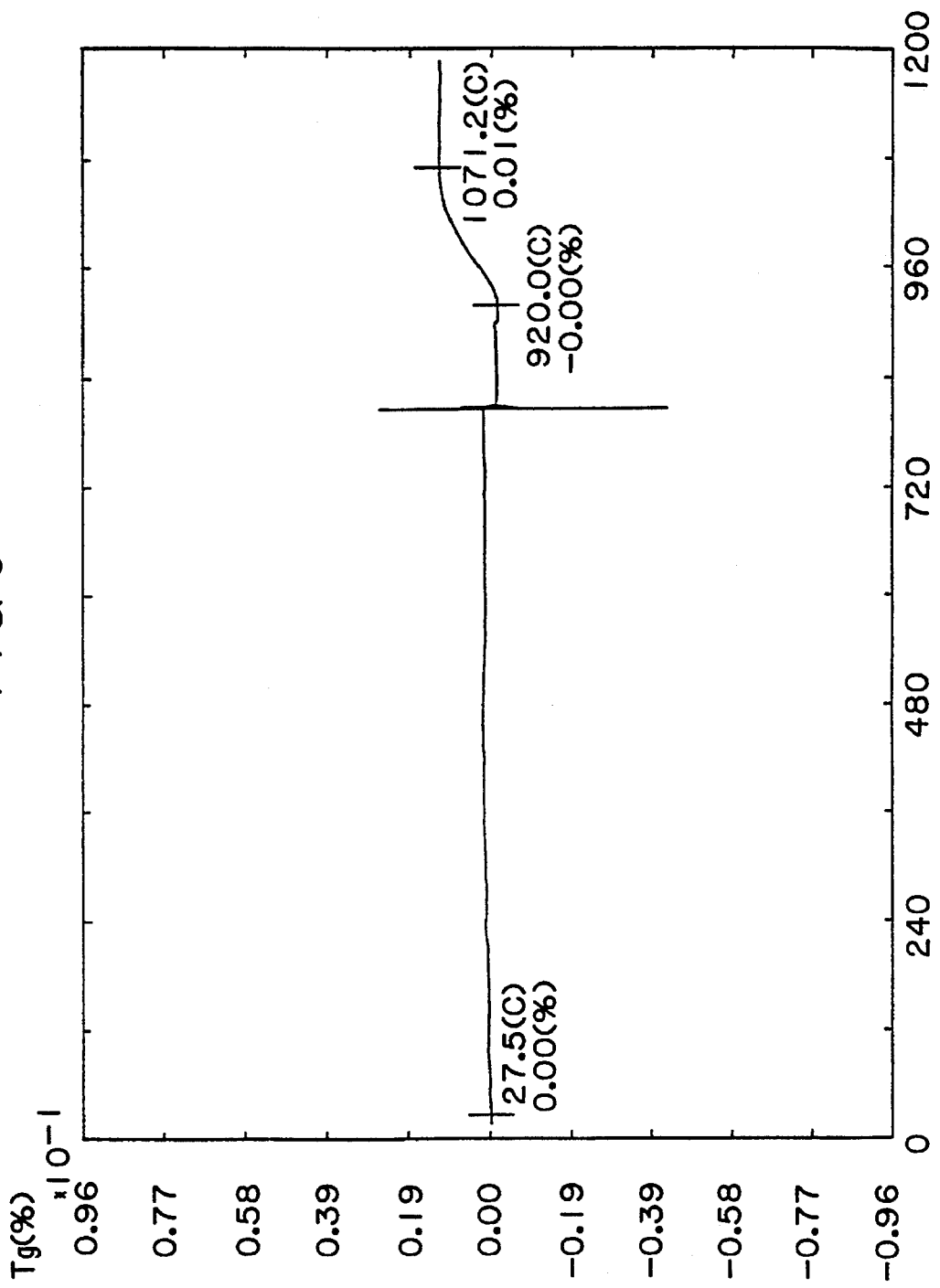

1

ULTRA-THIN FILM LAMINATE

This is a divisional application of Ser. No. 08/134,692, filed Oct. 12, 1993 now allowed.

This invention relates to an ultra-thin film laminate formed on the surface of a hard member such as cutting tools or wear-resistant tools or the surface of electric or electronic parts or sliding or mechanical parts.

The term "laminate" used herein refers to a coating layer (or film) itself and does not relate to a substrate which is steel, cemented carbides, cermet, ceramic or glass.

On cutting tools, it is an ordinary practice to form on a substrate a single or a plurality of coating layers of a carbide, nitride or carbonitride of Ti, Hf or Zr or an Al oxide by the PVD or CVD method to improve its wear resistance. The PVD method is especially preferred because the coatings formed by PVD can improve the wear resistance without lowering the strength of the substrate. Thus, the surface coatings formed by PVD are widely used for cutting tools for which high strength is required, such as drills, end mills, throwaway inserts and milling cutters.

But since such conventional surfaces coatings are all made of nitrides or carbonitrides having metallic bonding properties, they are not satisfactory in wear resistance and heat resistance. Thus, if tools having such surface coatings are used in high-speed cutting, the tool lives tend to be short.

On the other hand, covalent bonding compounds such as diamond, cubic boron nitride (cBN), silicon nitride ($Si_3N_4$) and aluminum nitride (AlN) have much higher hardness than carbides, nitrides and carbonitrides of Ti, Hf and Zr and also have high heat resistance. Thus, these materials are considered favorable as coating materials which can take the place of the above-described conventional materials.

But these materials are actually not used as surface coatings because they are extremely difficult to synthesize and because their adhesion is so low that they are liable to peel.

Under such circumstances, as disclosed in Japanese Patent Publication 61-235555 (DE3512986) by H. Holleck et al and in "Surface and Coatings Technology", Vol. 41 (1990), pages 179–190, trials have been made to improve the cutting properties of a cutting tool by forming a coating made of two different kinds of ceramics having metallic bonding properties such as TiC and $TiB_2$ and comprising as many as 100–20000 layers, each layer in the form of a thin film or a particulate having a film thickness or particle diameter of 40 nm or less. The interfaces between the layers are coherent or partially coherent.

Such a multi-layered coating is formed by sputtering using TiC, $TiB_2$ targets. According to "Surface and Coatings Technology", vol. 41 (1990), pages 179–190, crystalline or amorphous mixed layers having a thickness of about 2–3 nm formed at the coherent or partially coherent interfaces serve to disperse energy by expelling cracks. Since the propagation of cracks is restrained, the wear resistance improves. But in this publication it is not confirmed that the hardness, one of the indexes of wear resistance, improves.

On the other hand, M. S. Wong and W. D. Sproul reported that, by alternately laminating layers of two different kinds of metallic bonding nitrides, each several nanometers thick, its hardness increases when the entire thickness reaches a given point.

But since any of such prior coatings is made of different kinds of metallic bonding compounds having the same bond property, no significant increases in the resistance to oxidation and high-temperature hardness are attainable. Especially for cutting tools used for high-speed cutting, they are insufficient in heat resistance, which is a necessary property to achieve a long tool life.

Conventional film coatings used as wear-resistant and protective films for electric and electronic parts and sliding and machine parts were also not satisfactory.

A magnetic memory medium, for example, requires a surface protective film to protect it against damages during slidal movement. Such protective films are required to have high wear resistance, high adhesion to the substrate and high surface lubricity. Among them, the wear resistance is mainly determined by its hardness.

Conventional protective films are made of oxides or nitrides such as $SiO_2$, $Si_3N_4$ and $Al_2O_3$ or carbon and have a thickness of about 80 nm. But in order to increase the density and capacity of a magnetic memory medium, the protective film formed thereon is required to have a thickness of not more than 50 nm. However, if the thickness of such a conventional film were reduced to 50 nm or less, its wear resistance and corrosion resistance would drop noticeably.

An object of the present invention is to provide an ultra-thin film laminate which can improve the wear resistance, heat resistance and corrosion resistance of cutting tools, wear-resistant tools, electric and electronic parts and sliding and machine parts.

According to this invention, there is provided with an ultra-thin film laminate comprising at least one nitride or carbonitride of at least one element selected from the group consisting of the elements in the groups IVa, Va and VIa in the periodic table and Al and B, the nitride or carbonitride having a cubic crystal structure and having mainly metallic bonding properties, and at least one compound having a crystal structure other than the cubic crystal structure at normal temperature and normal pressure and under equilibrium state and having mainly covalent bonding properties, at least one nitride or carbonitride and the compound being alternately laminated in the form of layers, each layer of the nitride or carbonitride and the compound having a thickness of 0.2–20 nm, the laminate having a cubic crystalline X-ray diffraction pattern as a whole.

In this arrangement, the crystal structure of the covalent bonding compound that constitutes one of the two components of the film laminate is modified into a cubic crystal structure, which is a structure inherent to a metallic bonding compound. The ultra-thin film laminate thus formed has both the properties of the covalent bonding compound and those of the metallic bonding compound and has a cubic crystal structure as a whole.

Either of the metallic bonding compound and the covalent bonding compound may comprise elements which are completely different from the elements forming the other compound. Otherwise, some or all of the elements forming the respective compounds may be the same with only their compositions different from each other.

The entire thickness of the film laminate should be 5 nm–10 μm for use as a wear-resistant or a protective film for electric or electronic parts and should be 0.1–10 μm for use as such a film for machine parts.

The ultra-thin film laminate may have a structure in which no interfaces are formed between the adjacent layers of two or more compounds, with only part or all of the composition of each compound changing continuously, while some part thereof is a cubic crystalline covalent bonding compound.

Also, it may have a structure in which clear interfaces are present at some portions and no clear interfaces are present at other portions with only the composition changing continuously.

Such a ultra-thin film laminate can be formed by the PVD method such as sputtering or ion plating. With the PVD method, the strength of the substrate can be kept high and thus e.g. the tool keeps the resistance to wear and chipping at high level.

Among the PVD methods, the arc ion plating method is the most preferable to form the cubic crystalline covalent bonding compound according to the present invention, because with this method, a high ionization rate is attainable and thus a covalent bonding compound having high crystallizability can be formed.

If a higher ionization rate is desired, the laminate may be formed by a reactive PVD method, instead of using nitride or carbonitride targets, using a plurality of metal or alloy targets containing elements in the IVa, Va and VIa groups in the periodic table and B and Al and a gas containing at least C and N as raw materials.

If the ultra-thin film laminate of the present invention is to be coated on cutting tools such as inserts, drills and end mills made of a hard substrate such as WC-based cemented carbide, cermet and high-speed steel, it is preferable to interpose, at the interface between the substrate and the ultra-thin film laminate, an intermediate layer having a thickness of 0.05–5 μm and made of at least one compound selected from compounds comprising at least one element selected from the elements in the IVa, Va and VIa groups and at least one element selected from C and N and oxides of an element in the IVa group in order to improve the adhesion of the laminate to the substrate.

Similarly, for higher wear resistance, it is preferable to form on the ultra-thin film laminate a surface layer having a thickness of 0.1–5 μm and made of at least one compound selected from nitrides, carbides, carbonitrides and oxides of elements in the IVa, Va and VIa groups and oxides of an element in the IVa group.

When covering the film laminate of the present invention on cutting tools, especially on cutting inserts, the ultra-thin film laminates formed on the flank and rake race of the insert should preferably be laminated in different cycles according to the properties required for the respective surfaces.

In FIGS. 1 and 2, numerals 1 designates the ultra-thin film laminate formed on the substrate 2. Numerals 3 and 4 designate the surface layer and the intermediate layers, respectively.

The ultra-thin film laminate according to the present invention is formed by alternately laminating layers of at least one cubic crystalline metallic bonding compound and layers of at least one cubic crystalline covalent bonding compound which has a crystal structure other than the cubic structure at normal temperature and normal pressure in an equilibrium state so that the laminate has a cubic crystal structure as a whole. Each layer has an extremely small thickness of 0.2–20 nm. The laminate thus formed has exceptionally high hardness and oxidation resistance and thus shows excellent wear resistance and heat resistance.

A covalent bonding compound usually has a crystal structure other than the cubic structure and has high hardness and excellent heat resistance. For example, aluminum nitride (AlN) used as a sintered body has the Wurtzite structure at normal temperature and pressure in the equilibrium phase and is very high both in hardness and heat resistance.

On the other hand, diamond and cubic boron nitride (cBN), which are covalent bonding compounds having a cubic crystal structure, that is, a non-equilibrium phase, at normal temperature and pressure, are excellent in hardness and heat resistance. Thus, it is presumed that other covalent bonding materials having such a cubic crystalline non-equilibrium phase have extremely high properties, too.

But such compounds are actually not used as wear-resistant or protective films at all. This is because such films are extremely difficult to synthesize and, if synthesized at all, have a very low adhesion to ordinary tool substrate such as cemented carbide, high-speed steel and cermet and to films of metallic bonding hard materials having cubic NaCl type crystal structures such as TiN, TiC and TiCN, which are ordinarily used as an intermediate layer.

If compounds of the above-described two types were alternately laminated in an attempt to form a film laminate keeping the properties of both compounds, peeling would occur easily between the adjacent layers because the adhesion therebetween is low. Such a multi-layered film is thus practically useless.

This is because the covalent bonding compounds and the metallic bonding compounds have completely different bonding properties and different crystal structures from each other and thus atoms are not bonded together with a sufficiently strong force at the interfaces between the film laminate and the substrate or between the film laminate and the intermediate layer and between the adjacent layers of the film laminate.

According to the present invention, a covalent bonding compound having no cubic crystal structure at normal temperature and pressure in the equilibrium state is formed with an extremely thin layer of 20 nm or less and layers of a cubic crystalline metallic bonding compounds are laminated on the former layer. Thus, the covalent bonding compound acquires a cubic crystal structure. Due to the fact that both compounds now have the same cubic crystal structure and that the cubic crystal covalent bonding compound has extremely excellent properties, atoms are bonded together with a sufficiently strong force at the interfaces between the adjacent layers. Further, such a laminate has a sufficient adhesion to the substrate or the intermediate layer and is higher in hardness and resistance to oxidation than conventional coating films.

Other factors that increase the hardness of the ultra-thin film laminate are the accumulation of strain energy when the crystal structure of the covalent compound changes to the cubic crystal type and the accumulation of strain energy when the atoms at the interfaces are bonded together and thus the compound layers are subject to strains.

The thickness of the metallic bonding compound layers is not limited to a specific range. But if they are too thick compared with the thickness of the covalent bonding compound layers, the favorable effects brought about by the covalent bonding compound, such as high hardness and high resistance to oxidation, may not appear fully. Thus, the thicknesses of both the compound layers should not exceed 20 nm.

On the other hand, if the thickness of each compound layer is less than 0.2 nm, the two compounds would be mixed together, forming a homogeneous single-layered film. Thus, the above-described effects would be lost.

Either of the at least one metallic bonding compound and the at least one covalent bonding compound may be made of elements which are completely different from the elements forming the other compound. Otherwise some or all of the elements forming the respective compounds may be the same. If all the elements forming the respective elements are the same, their compositions have to be different from each other.

The above-described effects of the ultra-thin film laminate according to the present invention have nothing to do with the presence of interfaces between the adjacent compound layers. Thus, it is not necessary that there be present clear or unclear interfaces between the compound layers. In other words, the adjacent compound layers may have such a structure that the composition of the compound layers changes continuously. The covalent bonding compound may have a cubic crystal structure within a certain range of composition.

In this case, the cubic crystal structure serves to stabilize the crystal structure of the covalent bonding compound. The hardness and oxidation resistance of the film laminate thus increase. It has been found out that the film laminate thus formed excels in wear resistance and heat resistance and significantly improves the cutting properties of the tool. Further, this serves to prevent peeling due to defects or a sharp change in the stress on the film.

In forming the ultra-thin film laminate according to the present invention, it is indispensable to form it by a film-forming process which can produce a covalent bonding compound containing little amount of amorphous components and thus having high crystallizability. It has been found out that the arc ion plating method, which is capable of ionizing the material elements at a high rate, is most suitable for this purpose. Films of a covalent bonding compound can be formed by the reactive ion plating method or the magnetron sputtering method. But the films formed by these methods inevitably contain amorphous components, which deteriorate their favorable properties.

In order to increase the ionization rate, a reactive PVD method is preferable, because in this method are used a plurality of metal or alloy targets containing at least one of the elements in the IVa, Va, VIa groups and B and Al and a gas containing one or both of C and N as raw materials instead of targets of nitride or carbide compounds. For higher crystallizability of the compounds formed, inert gases such as Ar and He or gases having etching effects such as $H_2$ may be introduced into the film-forming oven besides the material gases.

The ultra-thin film laminate thus formed according to the present invention shows a Vickers hardness of as high as 4000 kgf/mm$^2$ at the load of 1 gf.

If the ultra-thin film laminate of the present invention is coated on a hard substrate such as WC-based cemented carbide, cermet and high-speed steel to produce a wear-resistant part, its thickness should be 0.5–10 μm. If less than 0.5 μm, the wear resistance scarcely improves. If thicker than 10 μm, the adhesion between the substrate and the film decreases due to residual stress in the film.

If the ultra-thin film laminate is formed directly on the substrate, the adhesion between the substrate and the film laminate may be lower than with a conventional coating film. It has been found out that the adhesion can be improved by forming between the substrate and the film laminate an intermediate layer made of at least one compound selected from compounds comprising at least one element selected from the group consisting of the elements in the IVa, Va and VIa groups and at least one element selected from C and N and oxides of an element in the IVa group. Further, by providing an intermediate layer having neutral properties between the ultra-thin film laminate and the substrate, which have largely different properties from each other, the properties can be changed gradually between the film laminate and the substrate. It can be expected that this will lead to a reduction in the residual stress in the film laminate.

When the intermediate layer was thinner than 0.05 μm, the adhesion did not improve. Also, further improvement was not seen when the thickness was increased above 5 μm. From the viewpoint of its properties and productivity, the intermediate layer should have a thickness of 0.05 to 5 μm.

Further, according to one example of the present invention, a surface layer having a thickness of 0.1 to 5 μm provided on top of the wear-resistant film coating according to the present invention serves to improve the performance of the wear-resistant coating. Since the outermost layer of the wear-resistant coating tend to be exposed to a very harsh environment, it is liable to be deteriorated by reacting with the atmosphere or the mating member in frictional contact. The wear resistance of the film will thus drop. On the other hand, the components forming the ultra-thin film laminate are not limited to those low in reactivity. Thus, by providing a surface layer made of a material which is excellent in resistance to reaction with the atmosphere or mating member, the film can be protected against wear due to surface reaction. If this layer is thinner than 0.1 μm, the wear resistance will not improve. But if thicker than 5 μm, it will not improve either because of peeling. Thus, its thickness should be 0.1–5 μm.

It was confirmed that by applying the wear-resistant coating containing the ultra-thin film laminate according to the present invention to cutting tools such as inserts, drills and end mills, their cutting performance and lives improve markedly.

Further, the present inventors have discovered that if the laminating cycle of the ultra-thin film laminate provided on the rake face of an insert of a cutting tool is longer than that of the ultra-thin film laminate provided on its flank, the cutting performance and the life of the insert improve markedly. Also, it was found out that, if the shape of the insert and its intended use are different, the cutting performance and the life of the cutting insert may improve markedly if the laminating cycle of the ultra-thin film laminate provided on the flank of an insert of a cutting tool is longer than that of the ultra-thin film laminate provided on the rake face. This is presumably because the wear resistance and oxidation resistance properties required for the flank and the rake face of the insert and thus the optimum laminating cycle vary according to its intended use.

The term "laminating cycle" herein used refers to the sum λ of the thicknesses of four layers 1A, 1B, 1C and 1D of four different compounds A, B, C and D shown in FIGS. 1A and 1B.

The ultra-thin film laminate according to the present invention can also improve the wear resistance of electric or electronic parts or sliding or machine parts if they are used as a wear-resistant or protective film therefor.

For use as a wear-resistant or protective film for electric or electronic parts or sliding or machine parts, it can not improve the wear resistance sufficiently if its thickness is less than 5 nm. If thicker than 10 μm, however, the adhesion of the film laminate to the substrate will become too low. Thus, its thickness should be between 0.005–10 μm when used as a wear-resistant or protective film for such parts.

The ultra-thin film laminate according to the present invention has hard layers of a cubic crystal covalent bonding compound, which is not obtainable at normal temperature and pressure in the equilibrium state. Thus, it has much higher wear resistance and toughness than conventional coating films. If it is applied to a cutting tool or a wear-resistant tool, it is less liable to wear and chipping and maintains good properties for a long period of time.

The ultra-thin film laminate of this invention may also be used as a wear-resistant coating for electric or electronic parts or sliding or machine parts to improve their wear resistance.

Another advantage of this film laminate is that it can be made significantly thinner than conventional films. Thus, especially if it is used as a coating on a magnetic memory medium, it makes it possible to increase the memory density and capacity. Further, the surface coating according to the present invention will achieve favorable effects if it is used as a coating for a member which is free of wear by friction, e.g. a photomagnetic memory medium, which needs a surface protective film having excellent optical and electrical properties, optical parts such as optical lenses, and circuit boards.

Other features and objects of the present invention will become apparent from the following description made with reference to the accompanying drawings, in which:

FIG. 5 is a graph showing how the weight of the ultra-thin film laminate made of TiN and AlN (thickness of layer: TiN: 1.25 nm, AlN: 1.25 nm) changes as the atmospheric temperature rises.

Now description will be made of the examples of protective films applied to the contact surfaces of cutting tools and magnetic disks.

In the examples, the thicknesses of the compound layers of the ultra-thin film laminate and the laminating cycle were determined by means of a transmission electron microscope. The change in composition of each layer was confirmed by AES or microarea EDX with a transmission electron microscope. The crystal structure of the entire ultra-thin film laminate was determined according to its X-ray diffraction pattern. Its microscopic crystal structure can be confirmed by the TED pattern observed through a transmission electron microscope. The X-ray diffraction peak was obtained by observing the diffracted rays of Cu-Kα rays by the θ-2θ method with a diffractometer using copper targets and nickel filters. The film hardness was measured by the Vickers hardness measuring method at the load of 25 gf. The Vickers hardness of 4000 kgf/mm$^2$ at the load of 1 gf is substantially equivalent to 3000 kgf/mm$^2$ at the load of 25 gf.

(EXAMPLE 1)

We prepared a cutting insert made of a cemented carbide having a composition P30 under the JIS standards and having a shape SNG432 under the JIS standards. An ultra-thin film laminate was formed on the surface thereof by an ion plating method using vacuum arc discharge.

Figure 1A:
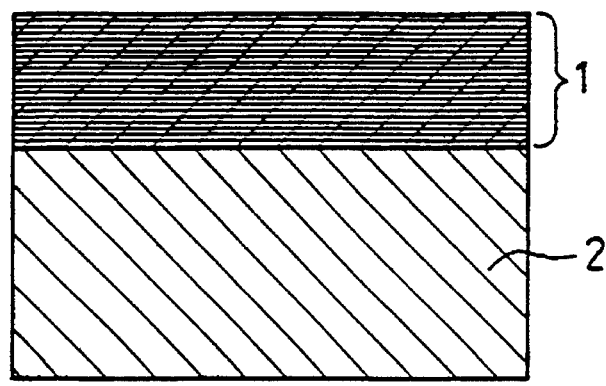
FIG. 1A is a schematic view showing the ultra-thin film laminate according to this invention coated on a substrate.
Figure 1B:
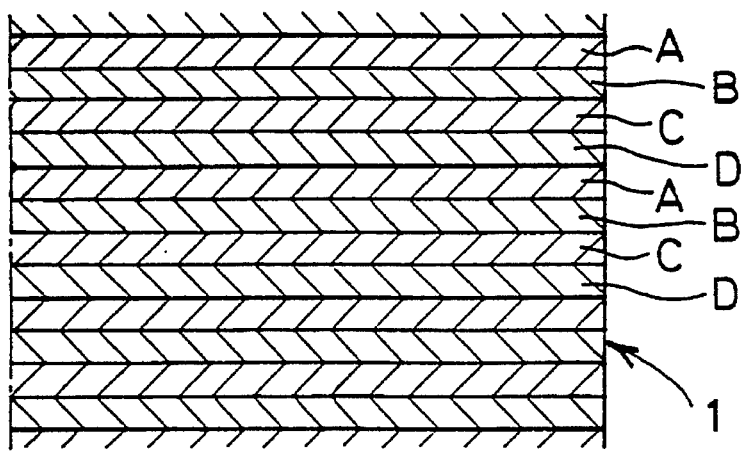
FIG. 1B is a partial enlarged view of the same.
Figure 2:
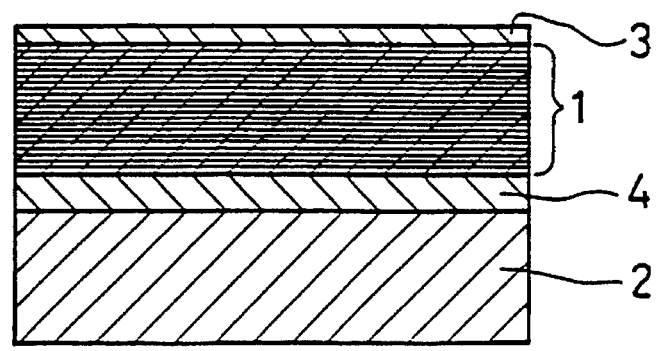
FIG. 2 is a schematic view of the ultra-thin film laminated according to this invention coated on a substrate with an intermediate layer and a surface layer.
Figure 3A:
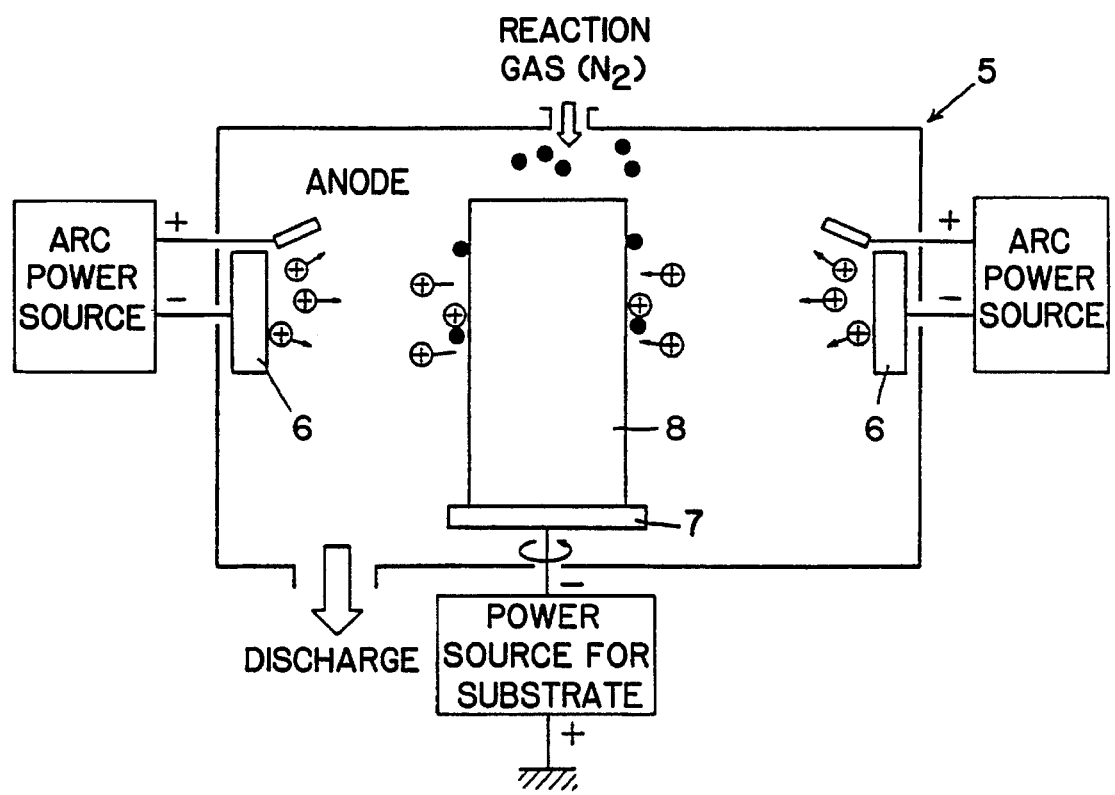
FIG. 3A is a view showing the process of manufacturing the ultra-thin film laminate according to this invention.

Namely, as shown in FIG. 3, a plurality of targets 6 were arranged in a circle in a film-forming device 4 and the above-mentioned cutting insert 8 was placed on a substrate carrier 7 adapted to rotate about the center of the circularly arranged targets. The thicknesses of the compound layers of the film were controlled by adjusting the revolving speed of the cutting insert and the vacuum arc discharge current (amount of evaporation of the material of which the targets are made).

The degree of vacuum in the film-forming device 4 was initially set at $10^{-5}$ Torr. Then argon gas was introduced and while keeping the pressure at $10^{-2}$ Torr, the gas was heated to 500° C. Then after cleaning the cutting insert by applying a voltage of −1000V, the argon gas was exhausted. The targets, made of elements in the IVa, Va and VIa groups in the periodic table and Al and B and a Ti-Al compound, was vaporized and ionized by vacuum arc discharge for a period of time determined by the revolving speed of the substrate, while introducing one or both of $N_2$ gas and $CH_4$ gas into the film-forming device 4 at the rate of 200 cc/min. Layers of compounds of C and N contained in the targets and the gases introduced into the device 4 are formed on the rotating insert when it passes each target. The thus formed specimens 1-1–1-24 according to the present invention are shown in Table 1.

Table 1 shows the laminating cycle and the thickness of the compound layers for each of the specimens 1-1–1-25 according to the present invention, as measured on a transmission electron microscope.

For comparison, we also prepared specimens 1-25 to 1-2 which are cutting inserts having conventional surface coatings. They are also shown in Table 1. These specimens were made by forming hard coating layers of TiN and/or TiCN on cutting inserts having the same composition and shape as above in the same manner as above, by use of targets of Cr and V for specimen 1-25 and by ion plating using vacuum arc discharge by use of a conventional film forming device for specimens 1-26 and 1-27. Specimen 1-28 was made by forming hard coating layers of TiN and $Al_2O_3$ on cutting inserts having the same composition and shape as above by the CVD method.

Specimens 1-2 to 1-24 according to the present invention all had extremely high Vickers hardness of 3500 kg/mm$^2$ or more under a load of 25 gf. As to specimen 1-1, the laminating cycle of the layers was 0.3 nm, i.e. the thickness of each compound layer was 0.15 nm. By the TEM observation, it was clear that it did not have clearly laminated structure but had mixed-phase as a whole. Its hardness was the lowest among the specimens according to the present invention.

The surface-coated cutting insert specimens in Table 1 were subjected to continuous and interrupted cutting tests under the conditions shown in Table 2. After the tests, the width of wear on the flank of the cutting edge of each specimen was measured.

It is apparent from Table 3 that, among the specimens having conventional surface coatings, specimens 1-25 to 1-27, in which hard coating layers were formed by PVD method, were poor in wear resistance and specimen 1-28, formed by CVD, showed low resistance to chipping of cutting edge due to reduced toughness of the substrate. In contrast, specimens 1-1 to 1-24 according to the present invention showed excellent wear resistance both in the continuous and interrupted cutting tests. Further, since their hard coating layers were formed by the PVD method, their substrates maintained high toughness, which lead to high resistance to chipping.

From the test results for specimens 1-1 to 1-8, it was found out that for use of the film laminates to cutting tools, the laminating cycle should be 0.5–20 nm, i.e. the thickness of each layer should be 0.2–20 nm. Also, from the test results for specimens 1-15–1-21, it is apparent that the thickness of the intermediate layer should be 0.05–5 μm. Further, the test results for specimens 1-9–1-14 show that the entire thickness of the ultra-thin film laminate should be 0.5–10 μm.

Although specimen 1-25 has the same laminated structure as specimens 1-1 to 1-24, it is low both in hardness and wear resistance because it does not contain a layer of cubic crystalline covalent bonding compound.

(EXAMPLE 2)

In this example, two kinds of films made of a Ti nitride and an Al nitride were alternately formed on the same substrates as those used in Example 1, using the same device and in the same way as in Example 1.

Namely, targets of Ti and Al were arranged opposite to each other. Then the cutting insert was cleaned in the atmosphere kept at $10^{-2}$ Torr by introducing argon gas and applying a voltage of −2000V and heating to 500° C. After exhausting the argon gas, the Ti target and the Al target were evaporated and ionized by vacuum arc discharge while introducing $N_2$ gas into the film forming device at the rate of 300 cc/min to form TiN and AlN layers alternately. The laminating cycle of the compound layers and thus their thicknesses were controlled by adjusting the rotating speed of the substrate and the amount of vacuum arc discharge. The entire thickness was controlled by adjusting the coating time.

Specimen 4-1 to 4-9 thus formed had its surface coated with an ultra-thin film laminate having a thickness shown in Table 4 and comprising alternately laminated ultra-thin films of TiN and AlN.

Figure 4:
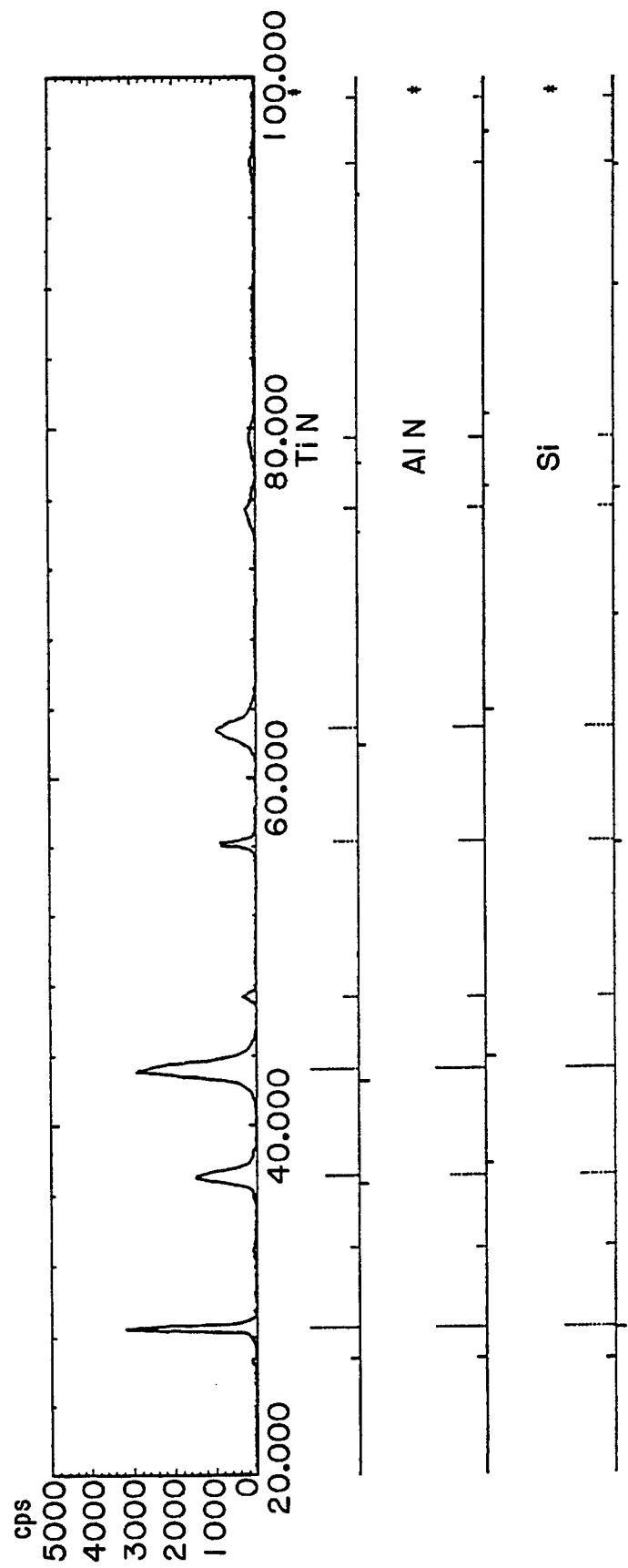
FIG. 4 is a view showing an X-ray diffraction pattern of an ultra-thin film laminate made of TiN and AlN (thickness of layer: TiN: 1.25 nm, AlN: 1.25 nm)

For the specimen 4-1, the peak of X-ray diffraction was observed at the angle between the TiN layers and the AlN layers, the latter now having a cubic crystal structure by being combined with the TiN layers. For example, the peak of X-ray diffraction for (111) plane at 2θ was 37.1° for the ultra-thin film laminate, 36.7° for TiN and 37.8° for cubic AlN. The results of observation of X-ray diffraction are shown in FIG. 4.

The Vickers hardness of this specimen was 3600 kgf/mm² at the load of 25 gf. Further, in order to measure the resistance to oxidation, the ultra-thin film laminate formed on a platinum substrate was heated in the air at the rate of 5° C./min up to 1200° C. while observing how its weight changes. The higher the rate of increase in weight, the more the oxidation of the laminate. As shown in FIG. 5, the weight of the specimen 4-1 increased very little. FIG. 5 shows that for specimen 4-1 the oxidation start temperature is very high, 920° C. For other specimens 4-2 to 4-8 in Table 4, too, similar X-ray diffraction patterns and weight changes were observed.

The specimens 4-1 to 4-9 had the following structure (specimens 4-1-4-4, laminating cycle: 2.5 nm, layer thickness: 1.25 nm each, specimens 4-5-4-8, laminating cycle: 0.4 nm, layer thickness: 0.2 nm each, specimen 4-9, laminating cycle: 25 nm, layer thickness: 21 nm for TiN, 4 nm for AlN). The specimen 4-9 had a Vickers hardness of 2900 kgf/mm² at load of 25 gf.

For comparison, we also prepared comparative specimens 5-1-5-6 (Table 5) by coating the same cutting inserts with the same film forming device. We coated their surfaces with single-layered films or composite films of TiN, TiC and TiCN (Table 5, specimens 5-1-5-3), with composite films of TiC and TiN by an ordinary CVD method (Table 5, specimen 5-4), with composite films of TiN and $Al_2O_3$ by the same CVD method (Table 5, specimen 5-5), with a single-layered film of TiAlN by PVD method (Table 5, specimen 5-6).

These specimens were subjected to continuous and interrupted cutting tests under the conditions shown in Table 2 and the width of wear on the flank of the cutting edge of each specimen was measured. The test results for the specimens of the present invention and comparative specimens are shown in Tables 4 and 5.

It is apparent from the results shown in Table 4 and 5 that the specimens according to the present invention (specimens 4-1-4-8 in Table 4) excel the comparative specimens (specimens 5-1-5-6 in Table 5) in the wear resistance and chipping resistance and thus show higher cutting performance than the comparative specimens. Also, the test results for the specimen 4-9 (Table 4) clearly shows that if the thickness of each layer exceeds 20 nm, the effect of lamination is lost and the cutting performance reduces.

(EXAMPLE 3)

In the same way as in Example 2, we prepared specimens 6-1-6-5 (Table 6) according to the present invention which are surface-coated cutting inserts made of cermet and having their surfaces coated with films of TiN and AlN on a substrate of cermet as shown in Table 6, and comparative specimens 7-1-7-6 (Table 7) in the same way as in Example 2. After subjecting them to cutting tests under the conditions shown in Table 2, the width of wear of each specimen was measured.

The laminating cycle and thickness of each layer for specimens 6-1-6-5 are as follows: specimen 6-1: cycle 0.4 nm, thickness 0.2 nm, specimens 6-2-6-5: cycle 14.7 nm, thickness: 8.2 nm for TiN and 6.5 nm for AlN.

Table 6 clearly shows that the specimens 6-1-6-5 according to the present invention (Table 6) have higher wear resistance and chipping resistance and thus higher cutting performance than the comparative specimens 7-1-7-6 (Table 7).

(EXAMPLE 4)

In the same way as in Example 3, we prepared specimens 8-1-8-5 (Table 8) according to the present invention which are surface-coated cutting inserts with substrate of ceramics and having their surfaces coated with films of TiN and AlN shown in Table 8, and comparative specimens 9-1-9-4 of inserts also made of ceramics (Table 9). After subjecting them to cutting tests under the conditions shown in Table 2, the width of wear of each specimen was measured.

Table 8 clearly shows that the specimens 8-1-8-5 according to the present invention (Table 8) have higher wear resistance and chipping resistance and thus higher cutting performance than the comparative specimens 9-1- 9-4 (Table 9).

(EXAMPLE 5)

We prepared surface-coated cutting inserts according to the present invention having their surfaces coated with films of TiN and TiAlN alloys in the same way as in Example 2, but using Ti and TiAl, instead of Ti and Al, as targets (Table 10, specimens 10-1-10-8), and a surface-coated cutting insert according to the present invention having its surface coated with films of TiN and AlN formed by the same method as in Example 2 (Table 10, specimen 10-9).

Each of the film layers TiN and TiAlN formed in specimens 10-1–10-9 had the following thickness: specimen 10-1: 0.15 nm, specimen 10-2: 1 nm, specimen 10-3: 10 nm, specimen 10-4: 25 nm, specimen 10-5: 50 nm, specimens 10-6 –10-9: 2 nm. The width of wear of each specimen was also measured after cutting tests in the conditions shown in Table 2.

When a single-layer film of TiAlN alloy was made by use of the Ti-Al alloy target, the film had a crystal structure of Wurtzite structure.

Table 10 clearly shows that the specimens 10-1–10-9 according to the present invention (Table 10) have higher wear resistance and chipping resistance and thus higher cutting performance than the comparative specimens 5-1–5-6 (Table 5). However, it was noted that specimen 10-1 having a layer thickness of less than 0.2 nm, specimens 10-4 and 10-5 having a layer thickness exceeding 20 nm, revealed no effects of lamination and were inferior in cutting performance to the other specimens 10-2, 10-3 and 10-6–10-8 in Table 10 according to the present invention. Also, specimen 10-8 according to the present invention showed fairly wide wear presumably due to peeling at the interfaces between the adjacent films forming the ultra-thin film laminate. Such wide wear was not observed in the other specimens 10-2, 10-3 and 10-6–10-8 according to the present invention.

(EXAMPLE 6)

Using as targets Al and Ti-Al alloy having a different composition than in Example 5, we prepared surface-coated cutting inserts according to the present invention having their surfaces coated with AlN and TiAlN films shown in Table 11 in the same way as in Example 5 (Table 11, specimens 11-1–11-8), and surface-coated cutting inserts according to the present invention having its surface coated with TiN and AlN films formed in the same way as in Example 2 (Table 11, specimen 11-9). When a single-layer film of TiAlN alloy was made by use of the Ti-Al alloy target, the film had a crystal structure of NaCl structure.

Each of the film layers formed on specimens 11-1–11-9 had the following thickness: specimen 11-1: 0.15 nm, specimen 11-2: 1 nm, specimen 11-3: 10 nm, specimen 11-4: 25 nm, specimen 11-5: 50 nm, specimens 11-6–11-9: 2 nm. The width of wear of each specimen was also measured after cutting tests under the conditions shown in Table 2.

Table 11 clearly shows that the specimens 11-1–11-9 according to the present invention (Table 11) have higher wear resistance and chipping resistance and thus higher cutting performance than the comparative specimens 5-1–5-6 (Table 5). However, it was noted that specimen 11-1 having a layer thickness of less than 0.2 nm, and specimens 11-4 and 11-5 having a layer thickness exceeding 20 nm, revealed no effects of lamination and were inferior in cutting performance to the other specimens 11-2, 11-3 and 11-6–11-8 according to the present invention. Also, specimen 11-9 according to the present invention showed fairly wide wear presumably due to peeling at the interfaces between the adjacent films. Such wide wear was not observed in the other specimens 11-2, 11-3 and 11-6–11-8 according to the present invention.

(EXAMPLE 7)

We prepared surface-coated cutting inserts according to the present invention having their surfaces coated with films shown in Table 12 in the same manner as in Example 2 (Table 12, specimens 12-1–12-13) and a surface-coated cutting insert according to the present invention having its surface coated with TiN and AlN films formed in the same manner as in Example 2 (Table 12, specimen 12-14).

Figure 3B:
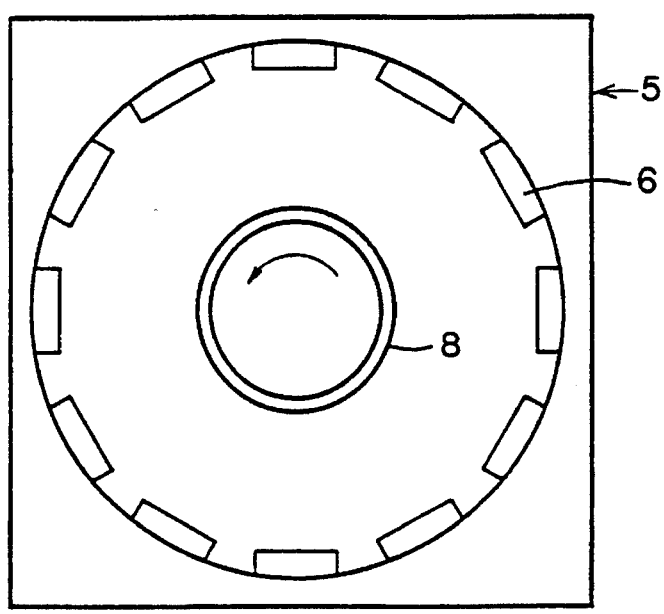
FIG. 3B is a schematic plan view of a film forming device.

In specimens 12-1–12-13, the composition of each compound layer was controlled by changing the number or arrangement of metal or alloy targets shown in FIG. 3B, composition of alloy and the intensity of the arc current. In this example, boundaries between the adjacent compound layers (e.g. TiN and AlN layers) may not be clear or may have graded structure and composition. In a case where the content of element, e.g. Al increases continuously from minimum to maximum in the direction of thickness of the film laminate, the thickness of each layer is determined as the distance between the point where the content of Al is maximum and the point where it is minimum. In another form, regions where the contents of two elements (e.g. Al and Ti) do not change are arranged through a region where their contents change continuously. In this case, the thickness of each compound layer is determined as the distance between the centers of the adjacent regions where the contents do not change.

Each of the film layers formed on specimens 12-1–12-13 (Table 12) had the following thickness: specimen 12-1: 0.15 nm, specimens 12-2 and 12-6–12-14: 2 nm, specimen 12-3: 10 nm, specimen 12-4: 25 nm, specimen 12-5: 50 nm. The width of wear of each specimen was also measured after cutting tests under the conditions shown in Table 2.

We examined changes in compositions of several layers of the specimens according to the present invention using an EDX for microscopic region observation equipped on a transmission electron microscope. In specimen 12-1, no such composition change was observed. This shows that specimen 12-1 does not have the structure according to the present invention. As for specimens 12-2–12-14, composition changes were clearly observed. Namely, where the content of Al is maximum, Ti was scarcely observed. This clearly shows that this part of the film laminate is made up essentially of AlN, a covalent bonding layer.

Table 12 clearly shows that the specimens 12-1–12-13 according to the present invention (Table 12) have higher wear resistance and chipping resistance and thus higher cutting performance than the comparative specimens 5-1–5-6 (Table 5). However, it was noted that specimen 12-1, having a layer thickness of less than 0.2 nm, and specimens 12-4 and 12-5, having a layer thickness exceeding 20 nm, revealed no effects of lamination and were inferior in cutting performance to the other specimens 12-2, 12-3 and 12-6–12-13 according to the present invention. Also, specimen 12-12–12-14 (Table 12) according to the present invention showed fairly wide wear presumably due to peeling at the interfaces between the adjacent films forming the ultra-thin film laminate. Such wide wear was not observed in the other specimens 12-2, 12-3 and 12-6–12-13 according to the present invention.

(EXAMPLE 8)

We prepared surface-coated cutting inserts according to the present invention made of cermet substrate and having their surfaces coated with films shown in Table 13 in the same way as in Example 7 (Table 13, specimens 13-1–13-8), and a surface-coated cutting insert according to the present invention made also of cermet and having its surface coated with TiN and AlN films formed in the same manner as in Example 2 (Table 13, specimen 13-9). Each of the film layers formed on specimens 13-1–13-9 had the following thickness: specimen 13-1: 0.15 nm, specimens 13-2 and 13-6–13-9: 2 nm, specimen 13-3: 10 nm, specimen 13-4: 25 nm, specimen 13-5: 50 nm. The width of wear of each specimen was also measured after cutting tests under the conditions shown in Table 2.

Table 13 clearly shows that the specimens 13-1–13-8 according to the present invention (Table 13) have higher wear resistance and chipping resistance and thus higher cutting performance than the comparative specimens 7-1–7-6 (Table 7). However, it was noted that specimen 13-1 having a layer thickness of less than 0.2 nm, and specimens 13-4 and 13-5 having a layer thickness exceeding 20 nm, revealed no effects of lamination and were inferior in cutting performance to the other specimens 13-2, 13-3 and 13-6–13-8 according to the present invention. Also, specimen 13-8 according to the present invention showed fairly wide wear presumably due to peeling at the interfaces between the adjacent films forming the ultra-thin film laminate. Such wide wear was not observed in the other specimens 13-2, 13-3 and 13-6–13-8 according to the present invention.

(EXAMPLE 9)

The wear resistance of films were measured by bringing each magnetic disk into contact with a magnetic disk. The magnetic head used was made of a sintered material comprising aluminum and titanium carbide (having a Vickers hardness of 400 kgf/mm$^2$ under the load of 25 gf). The head was pressed against the protective film formed on each magnetic disk under the load of 60 gf/cm$^2$. In this state, the disk was rotated at high speed until the magnetic head separates up from the disk. Once the head separates, the rotation of the disk was stopped to allow the head to be brought into contact with the disk again. This CSS (contact, start, stop) operation was repeated 100000 times. The results of this test are shown in Table 14.

Specimens 14-1–14-24 shown in Table 14 are wear-resistant films according to the present invention. These films were formed by sputtering. In Table 14, we showed only the laminating cycle. The thicknesses of the respective layers are equal to each other and exactly half the laminating cycle. For comparison, we also prepared specimens 14-14–14-25 having a protective film made of $SiO_2$, which is a conventional material. Since the entire film is extremely thin, it is impossible to directly measure its hardness. Thus, instead of the hardness of the film itself, we measured and showed the speed at which each film is etched when subjected to Ar ion beams (acceleration voltage: 3 kV) under vacuum, because it is known from experience that the hardness of the film is directly proportional to the etching speed.

Table 14 clearly shows that specimens 14-1 to 14-24 according to the present invention (Table 14) excel the comparative specimen in every respect. Further, the results for specimens 14-1–14-7 and 14-13–14-17 (Table 14) show that the thickness of each compound layer is preferably 0.2–10 nm. From the results for specimens 14-8–14-12 and 14-19–14-24 (Table 14), it is apparent the entire film thickness is preferably more than 5 nm.

TABLE 1

| Specimen | Hard layer composition (thickness: μm) | | | Ultra-thin film laminate | | | | | Film hardness | | XRD pattern** |
| | Intermediate layer | Base layer | Surface layer | Material (thickness: nm) | Material (thickness: nm) | Cycle (nm) | Total film thickness (μm) | Crystal ※ structure | Hv (kgf/mm$^2$) | Remark | of ultra-thin laminate |
|---|---|---|---|---|---|---|---|---|---|---|---|
| 1-1 | No | ※ | No | VN(0.15) | AlN(0.15) | 0.3 | 3.4 | Different | 3150 | PVD | Cubic |
| 1-2 | No | ※ | No | VN(0.2) | AlN(0.2) | 0.4 | 3.5 | Different | 3600 | PVD | Cubic |
| 1-3 | No | ※ | No | VN(1.0) | AlN(1.0) | 2.0 | 3.8 | Different | 4200 | PVD | Cubic |
| 1-4 | No | ※ | No | VN(1.8) | AlN(1.8) | 3.6 | 3.5 | Different | 5650 | PVD | Cubic |
| 1-5 | No | ※ | No | VN(3.5) | AlN(2.5) | 6.0 | 3.6 | Different | 3720 | PVD | Cubic |
| 1-6 | No | ※ | No | VN(6.0) | AlN(4.1) | 10.1 | 3.4 | Different | 3700 | PVD | Cubic |
| 1-7 | No | ※ | No | VN(8.0) | AlN(12.0) | 20.0 | 3.5 | Different | 3600 | PVD | Cubic |
| 1-8 | No | ※ | No | VN(21.0) | AlN(4.0) | 25.0 | 3.6 | Different | 3150 | PVD | ※・※・※ |
| 1-9 | No | ※ | No | VN(1.8) | AlN(1.8) | 3.6 | 0.3 | Different | 5000 | PVD | Cubic |
| 1-10 | No | ※ | No | VN(1.8) | AlN(1.8) | 3.6 | 0.5 | Different | 5400 | PVD | Cubic |
| 1-11 | No | ※ | No | VN(1.8) | AlN(1.8) | 3.6 | 2.0 | Different | 5550 | PVD | Cubic |
| 1-12 | No | ※ | No | VN(1.8) | AlN(1.8) | 3.6 | 5.0 | Different | 5740 | PVD | Cubic |
| 1-13 | No | ※ | No | VN(1.8) | AlN(1.8) | 3.6 | 10.0 | Different | 5800 | PVD | Cubic |
| 1-14 | No | ※ | No | VN(1.8) | AlN(1.8) | 3.6 | 13.0 | Different | 5920 | PVD | Cubic |
| 1-15 | TiN(0.01) | ※ | No | VN(1.8) | AlN(1.8) | 3.6 | 3.6 | Different | 5680 | PVD | Cubic |
| 1-16 | TiN(0.05) | ※ | No | VN(1.8) | AlN(1.8) | 3.6 | 3.7 | Different | 5550 | PVD | Cubic |
| 1-17 | TiN(0.5) | ※ | No | VN(1.8) | AlN(1.8) | 3.6 | 3.8 | Different | 5740 | PVD | Cubic |
| 1-18 | TiN(1.0) | ※ | No | VN(1.8) | AlN(1.8) | 3.6 | 3.9 | Different | 5850 | PVD | Cubic |
| 1-19 | TiN(3.0) | ※ | No | VN(1.8) | AlN(1.8) | 3.6 | 3.8 | Different | 5900 | PVD | Cubic |
| 1-20 | TiN(5.0) | ※ | No | VN(1.8) | AlN(1.8) | 3.6 | 3.7 | Different | 5930 | PVD | Cubic |
| 1-21 | TiN(7.0) | ※ | No | VN(1.8) | AlN(1.8) | 3.6 | 3.8 | Different | 5850 | PVD | Cubic |
| 1-22 | No | ※ | No | ZrN(0.15) | AlN(3.0) | 6.0 | 3.9 | Different | 4900 | PVD | Cubic |
| 1-23 | No | ※ | No | HfN(0.15) | AlN(3.0) | 6.0 | 3.6 | Different | 4870 | PVD | Cubic |
| 1-24 | No | ※ | No | ※・※ | | 3.0 | 3.2 | Different | 4400 | PVD | Cubic |
| 1-25 | No | ※ | No | CrN(1.7) | VN(1.7) | 3.4 | 3.7 | Same | 3200 | PVD | Cubic |
| 1-26 | TiN(1.0) | TiCN(2.0) | TiN(1.0) | | | | | | 3000 | PVD | |
| 1-27 | No | ※ | TiN(4.0) | | | | | | 2400 | PVD | |
| 1-28 | TiN(2.0) | Al$_2$O$_3$(1.0) | TiN(0.5) | | | | | | 2500 | CVD | |

TABLE 1-continued

| | Hard layer composition (thickness: μm) | | | Ultra-thin film laminate | | | | | Film hardness Hv (kgf/mm²) | Remark | XRD pattern** of ultra-thin laminate |
|---|---|---|---|---|---|---|---|---|---|---|---|
| Specimen | Intermediate layer | Base layer | Surface layer | Material (thickness: nm) | Material (thickness: nm) | Cycle (nm) | Total film thickness (μm) | Crystal ※ structure | | | |

※·Ultra-thin film laminate
※·※·ZrN(1.0), AlN(1.0), HfN(1.0)
※·※·※·Cubic + hexagonal
*Crystal structure of each single material layer (at normal temperature, pressure and equilibrium state)
**Crystal structure of ultra-thin film laminate (as a whole)

TABLE 2

| | Continuous cutting | Interrupted cutting |
|---|---|---|
| Material machined | SCM435 | SCM435 |
| Cutting speed (m/min) | 220 | 220 |
| Feed (mm/rev) | 0.37 | 0.30 |
| Depth of cut (mm) | 2.0 | 1.5 |
| Cutting time (min) | 15 | 20 |

TABLE 3

| | Flank wear (mm) | |
|---|---|---|
| Specimen | Continuous cutting | Interrupted cutting |
| 1-1 | 0.175 | 0.182 |
| 1-2 | 0.107 | 0.105 |
| 1-3 | 0.100 | 0.098 |
| 1-4 | 0.079 | 0.087 |
| 1-5 | 0.095 | 0.099 |
| 1-6 | 0.100 | 0.101 |
| 1-7 | 0.111 | 0.108 |
| 1-8 | 0.175 | 0.195 |

TABLE 3-continued

| | Flank wear (mm) | |
|---|---|---|
| Specimen | Continuous cutting | Interrupted cutting |
| 1-9 | 0.410 | 0.250 |
| 1-10 | 0.140 | 0.122 |
| 1-11 | 0.102 | 0.111 |
| 1-12 | 0.113 | 0.123 |
| 1-13 | 0.125 | 0.142 |
| 1-14 | 0.180 | 0.109 |
| 1-15 | 0.080 | 0.082 |
| 1-16 | 0.080 | 0.080 |
| 1-17 | 0.077 | 0.075 |
| 1-18 | 0.070 | 0.070 |
| 1-19 | 0.069 | 0.072 |
| 1-20 | 0.070 | 0.071 |
| 1-21 | 0.082 | 0.085 |
| 1-22 | 0.063 | 0.065 |
| 1-23 | 0.063 | 0.060 |
| 1-24 | 0.093 | 0.098 |
| 1-25 | 0.205 | 0.195 |
| 1-26 | 0.310 | 0.225 |
| 1-27 | 0.415 | 0.255 |
| 1-28 | 0.115 | Chipped off |

TABLE 4

| | | Hard coating layer | | | | | | Flank wear (mm) | |
|---|---|---|---|---|---|---|---|---|---|
| | Film forming method | First layer | | Second layer | | Third layer | | Interrupted cutting | Continuous cutting |
| Specimen | | Makeup | Film thickness (μm) | Makeup | Film thickness (μm) | Makeup | Film thickness (μm) | | |
| 4-1 | PVD | TiN & AlN laminated | 3.5 | — | — | — | — | 0.109 | 0.112 |
| 4-2 | PVD | TiN | 1 | TiN & AlN laminated | 3 | — | — | 0.103 | 0.109 |
| 4-3 | PVD | TiN & AlN laminated | 3 | TiN | 1 | — | — | 0.098 | 0.105 |
| 4-4 | PVD | TiN | 1 | TiN & AlN laminated | 3 | TiN | 1 | 0.098 | 0.099 |
| 4-5 | PVD | TiN & AlN laminated | 3.5 | — | — | — | — | 0.110 | 0.110 |
| 4-6 | PVD | TiN | 1 | TiN & AlN laminated | 3 | — | — | 0.102 | 0.108 |
| 4-7 | PVD | TiN & AlN laminated | 3 | TiN | 1 | — | — | 0.098 | 0.106 |
| 4-8 | PVD | TiN | 1 | TiN & AlN laminated | 3 | TiN | 1 | 0.099 | 0.098 |
| 4-9 | PVD | TiN & AlN laminated | 3.5 | — | — | — | — | 0.152 | 0.155 |

Substrate: cemented carbide

TABLE 5

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 5-1 | PVD | TiN | 1 | TiCN | 2 | TiN | 1 | 0.300 | 0.210 |
| 5-2 | PVD | TiN | 1 | TiCN | 1 | TiC | 2 | 0.205 | 0.080 |
| 5-3 | PVD | TiN | 4 | — | — | — | — | 0.410 | 0.250 |
| 5-4 | CVD | TiC | 3 | TiN | 2 | — | — | 0.205 | Chipped off |
| 5-5 | CVD | TiN | 2 | Al$_2$O$_3$ | 1 | TiN | 0.5 | 0.110 | Chipped off |
| 5-6 | PVD | TiAlN | 3.5 | — | — | — | — | 0.155 | 0.152 |

Substrate: cemented carbide

TABLE 6

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 6-1 | PVD | TiN & AlN laminated | 3.4 | — | — | — | — | 0.078 | 0.082 |
| 6-2 | PVD | TiN & AlN laminated | 4.1 | — | — | — | — | 0.095 | 0.092 |
| 6-3 | PVD | TiN | 1 | TiN & AlN laminated | 3 | — | — | 0.068 | 0.059 |
| 6-4 | PVD | TiN & AlN laminated | 3 | TiN | 1 | — | — | 0.070 | 0.066 |
| 6-5 | PVD | TiN | 1 | TiN & AlN laminated | 3 | TiN | 1 | 0.055 | 0.048 |

Substrate: cermet

TABLE 7

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 7-1 | PVD | TiN | 1 | TiCN | 2 | TiN | 1 | 0.232 | 0.214 |
| 7-2 | PVD | TiN | 1 | TiCN | 1 | TiC | 2 | 0.180 | 0.177 |
| 7-3 | PVD | TiN | 4 | — | — | — | — | 0.332 | 0.250 |
| 7-4 | CVD | TiC | 3 | TiN | 2 | — | — | 0.199 | Chipped off |
| 7-5 | CVD | TiN | 2 | Al$_2$O$_3$ | 1 | TiN | 0.5 | 0.116 | Chipped off |
| 7-6 | PVD | TiAiN | 3.5 | — | — | — | — | 0.105 | 0.112 |

Substrate: cermet

TABLE 8

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 8-1 | PVD | TiN & AiN laminated | 3.3 | — | — | — | — | 0.101 | 0.098 |
| 8-2 | PVD | TiN & AiN laminated | 4.1 | — | — | — | — | 0.116 | 0.109 |
| 8-3 | PVD | TiN | 1 | TiN & AlN laminated | 3 | — | — | 0.093 | 0.090 |
| 8-4 | PVD | TiN & AlN laminated | 3 | TiN | 1 | — | — | 0.070 | 0.069 |

TABLE 8-continued

| | Film forming method | Hard coating layer | | | | | | Flank wear (mm) | |
|---|---|---|---|---|---|---|---|---|---|
| | | First layer | | Second layer | | Third layer | | | |
| Specimen | | Makeup | Film thickness (μm) | Makeup | Film thickness (μm) | Makeup | Film thickness (μm) | Interrupted cutting | Continuous cutting |
| 8-5 | PVD | TiN | 1 | TiN & AlN laminated | 3 | TiN | 1 | 0.063 | 0.055 |

Substrate: ceramics

TABLE 9

| | Film forming method | Hard coating layer | | | | | | Flank wear (mm) | |
|---|---|---|---|---|---|---|---|---|---|
| | | First layer | | Second layer | | Third layer | | | |
| Specimen | | Makeup | Film thickness (μm) | Makeup | Film thickness (μm) | Makeup | Film thickness (μm) | Interrupted cutting | Continuous cutting |
| 9-1 | PVD | TiN | 1 | TiCN | 2 | TiN | 1 | 0.244 | 0.232 |
| 9-2 | PVD | TiN | 1 | TiCN | 1 | TiC | 2 | 0.238 | 0.218 |
| 9-3 | PVD | TiN | 4 | — | — | — | — | 0.404 | 0.389 |
| 9-4 | PVD | TiAlN | 3.5 | — | — | — | — | 0.154 | 0.143 |

Substrate: ceramics

TABLE 10

| | Film forming method | Hard coating layer | | | | | | Flank wear (mm) | |
|---|---|---|---|---|---|---|---|---|---|
| | | First layer | | Second layer | | Third layer | | | |
| Specimen | | Makeup | Film thickness (μm) | Makeup | Film thickness (μm) | Makeup | Film thickness (μm) | Interrupted cutting | Continuous cutting |
| 10-1 | PVD | TiN & TiAlN laminated | 3.5 | — | — | — | — | 0.148 | 0.142 |
| 10-2 | PVD | TiN & TiAlN laminated | 4 | — | — | — | — | 0.126 | 0.133 |
| 10-3 | PVD | TiN & TiAlN laminated | 3.8 | — | — | — | — | 0.134 | 0.138 |
| 10-4 | PVD | TiN & TiAlN laminated | 3.5 | — | — | — | — | 0.142 | 0.152 |
| 10-5 | PVD | TiN & TiAlN laminated | 3.8 | — | — | — | — | 0.192 | 0.196 |
| 10-6 | PVD | TiN | 1 | TiN & TiAlN laminated | 3 | — | — | 0.093 | 0.099 |
| 10-7 | PVD | TiN & TiAlN laminated | 3 | TiN | 1 | — | — | 0.096 | 0.102 |
| 10-8 | PVD | TiN | 1 | TiN & TiAlN laminated | 3 | TiN | 1 | 0.083 | 0.084 |
| 10-9 | PVD | TiN & AlN laminated | 3.5 | — | — | — | — | 0.151 | 0.162 |

Substrate: cemented carbide

TABLE 11

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 11-1 | PVD | AlN & TiAlN laminated | 3.5 | — | — | — | — | 0.172 | 0.178 |
| 11-2 | PVD | AlN & TiAlN laminated | 4 | — | — | — | — | 0.104 | 0.103 |
| 11-3 | PVD | AlN & TiAlN laminated | 3.9 | — | — | — | — | 0.112 | 0.114 |
| 11-4 | PVD | AlN & TiAlN laminated | 3.5 | — | — | — | 1 | 0.139 | 0.145 |
| 11-5 | PVD | AlN & TiAlN laminated | 3.8 | — | — | — | — | 0.192 | 0.188 |
| 11-6 | PVD | TiN | 1 | AlN & TiAlN laminated | 3 | — | — | 0.088 | 0.095 |
| 11-7 | PVD | AlN & TiAlN laminated | 3 | TiN | 1 | — | — | 0.098 | 0.102 |
| 11-8 | PVD | TiN | 1 | AlN & TiAlN laminated | 3 | TiN | 1 | 0.078 | 0.082 |
| 11-9 | PVD | TiN & AlN laminated | 3.5 | — | — | — | — | 0.142 | 0.144 |

Substrate: cemented carbide

TABLE 12

| Specimen | Film forming method | Hard coating layer ||||||  Flank wear (mm) ||
| | | First layer || Second layer || Third layer || | |
| | | Makeup | Film thickness (μm) | Makeup | Film thickness (μm) | Makeup | Film thickness (μm) | Interrupted cutting | Continuous cutting |
|---|---|---|---|---|---|---|---|---|---|
| 12-1 | PVD | Composition changed between TiN & AlN | 3.5 | — | — | — | — | 0.142 | 0.143 |
| 12-2 | PVD | Composition changed between TiN & AlN | 4 | — | — | — | — | 0.100 | 0.110 |
| 12-3 | PVD | Composition changed between TiN & AlN | 3.6 | — | — | — | — | 0.117 | 0.1110 |
| 12-4 | PVD | Composition changed between TiN & AlN | 3.5 | — | — | — | — | 0.140 | 0.142 |
| 12-5 | PVD | Composition changed between TiN & AlN | 3.8 | — | — | — | — | 0.189 | 0.193 |
| 12-6 | PVD | Composition changed between TiCN & AlN | 4 | — | — | — | — | 0.124 | 0.114 |
| 12-7 | PVD | Composition changed between TiC & AlN | 4 | — | — | — | — | 0.118 | 0.112 |
| 12-8 | PVD | TiN | 1 | Composition changed between TiN & AlN | 3 | — | — | 0.093 | 0.100 |
| 12-9 | PVD | Composition changed between TiN & AlN | 3 | TiN | 1 | — | — | 0.094 | 0.105 |
| 12-10 | PVD | TiN | 1 | Composition changed between TiN & AlN | 3 | TiN | 1 | 0.087 | 0.088 |
| 12-11 | PVD | Composition changed between AlN & TiAlN | 4.1 | — | — | — | — | 0.113 | 0.110 |
| 12-12 | PVD | Composition changed between TiN & TiAiN | 4.2 | — | — | — | — | 0.111 | 0.115 |
| 12-13 | PVD | TiN/TiN → AlN/AlN/AlN → TiN/ laminated | 4 | — | — | — | — | 0.113 | 0.109 |
| 12-14 | PVD | TiN & AlN laminated | 3.5 | — | — | — | — | 0.135 | 0.138 |

Substrate: cemented carbide

TABLE 13

| Specimen | Film forming method | Hard coating layer | | | | | | Flank wear (mm) | |
|---|---|---|---|---|---|---|---|---|---|
| | | First layer | | Second layer | | Third layer | | | |
| | | Makeup | Film thickness (μm) | Makeup | Film thickness (μm) | Makeup | Film thickness (μm) | Interrupted cutting | Continuous cutting |
| 13-1 | PVD | Composition changed between TiN & AlN | 3.5 | — | — | — | — | 0.124 | 0.122 |
| 13-2 | PVD | Composition changed between TiN & AlN | 4 | — | — | — | — | 0.108 | 0.099 |
| 13-3 | PVD | Composition changed between TiN & AlN | 3.8 | — | — | — | — | 0.100 | 0.101 |
| 13-4 | PVD | Composition changed between TiN & AlN | 3.5 | — | — | — | — | 0.127 | 0.122 |
| 13-5 | PVD | Composition changed between TiN & AlN | 3.8 | — | — | — | — | 0.162 | 0.178 |
| 13-6 | PVD | TiN | 1 | Composition changed between TiN & AlN | 3 | — | — | 0.077 | 0.087 |
| 13-7 | PVD | Composition changed between TiN & AlN | 3 | TiN | 1 | — | — | 0.074 | 0.085 |
| 13-8 | PVD | TiN | 1 | Composition changed between TiN & AlN | 3 | TiN | 1 | 0.067 | 0.063 |
| 13-9 | PVD | Composition changed between TiN & AlN | 3.5 | — | — | — | — | 0.121 | 0.138 |

Substrate: cermet

TABLE 14

| Specimen | Laminated material | Laminated cycle | Etching speed (nm/min) | Film thickness (nm) | CSS tests (after 100000 cycles) | | | XRD pattern of laminate material |
|---|---|---|---|---|---|---|---|---|
| | | | | | Corrosion resistance | Surface condition | Regenerating output | |
| 14-1 | ZrN/AlN | 0.3 nm | 0.43 | 50 | No change | Trace noticed | 2 dB drop | Cubic |
| 14-2 | ZrN/AlN | 0.5 nm | 0.18 | 50 | No change | No change | No change | Cubic |
| 14-3 | ZrN/AlN | 1.0 nm | 0.07 | 50 | No change | No change | No change | Cubic |
| 14-4 | ZrN/AlN | 2.5 nm | 0.05 | 50 | No change | No change | No change | Cubic |
| 14-5 | ZrN/AlN | 10 nm | 0.24 | 50 | No change | No change | No change | Cubic |
| 14-6 | ZrN/AlN | 20 nm | 0.31 | 50 | No change | No change | No change | Cubic |
| 14-7 | ZrN/AlN | 25 nm | 0.42 | 50 | No change | Trace noticed | 3 dB drop | ※ |
| 14-8 | ZrN/AlN | 2.5 nm | 0.07 | 2.5 | No change | Trace noticed | 5 dB drop | Cubic |
| 14-9 | ZrN/AlN | 2.5 nm | 0.08 | 5 | No change | No change | No change | Cubic |
| 14-10 | ZrN/AlN | 2.5 nm | 0.07 | 20 | No change | No change | No change | Cubic |
| 14-11 | ZrN/AlN | 2.5 nm | 0.08 | 30 | No change | No change | No change | Cubic |
| 14-12 | ZrN/AlN | 2.5 nm | 0.07 | 40 | No change | No change | No change | Cubic |
| 14-13 | AlN/CrN | 0.3 nm | 0.43 | 50 | No change | Trace noticed | 2 dB drop | Cubic |
| 14-14 | AlN/CrN | 0.5 nm | 0.18 | 50 | No change | No change | No change | Cubic |
| 14-15 | AlN/CrN | 2.5 nm | 0.07 | 50 | No change | No change | No change | Cubic |
| 14-16 | AlN/CrN | 10 nm | 0.05 | 50 | No change | No change | No change | Cubic |
| 14-17 | AlN/CrN | 20 nm | 0.24 | 50 | No change | No change | No change | Cubic |
| 14-18 | AlN/CRN | 25 nm | 0.42 | 50 | No change | Trace noticed | 3dB drop | ※ |
| 14-19 | AlN/CrN | 2.5 nm | 0.07 | 2.5 | No change | Trace noticed | 5 dB drop | Cubic |
| 14-20 | AlN/CrN | 2.5 nm | 0.08 | 5 | No change | Trace noticed | 5 dB drop | Cubic |
| 14-21 | AlN/CrN | 2.5 nm | 0.07 | 50 | No change | Trace noticed | 5 dB drop | Cubic |
| 14-22 | AlN/CrN | 2.5 nm | 0.08 | 1000 | No change | Trace noticed | 5 dB drop | Cubic |
| 14-23 | AlN/CrN | 2.5 nm | 0.07 | 10000 | No change | Trace noticed | 5 dB drop | Cubic |
| 14-24 | AlN/CrN | 2.5 nm | 0.08 | 20000 | No change | Trace noticed | 2 dB drop | Cubic |
| 14-25 | SiO | — | 0.03 | 80000 | No change | Trace noticed | 6 dB drop | — |

※Cubic + hexagonal

What is claimed is:

1. A wear-resistant member comprising a hard or surface-hardened substrate made of a WC-based cemented carbide, a cement or a hard-speed steel and an ultra-thin film laminate having a thickness of 0.5 to 10 μm coated on the surface of said substrate, said ultra-thin film laminate comprising at least one nitride or carbonitride of at least one element selected from the group consisting of the elements in the Groups IVa, Va and VIa in the Periodic Table and Al and B, said nitride or carbonitride having a cubic crystal structure and having mainly metallic bonding properties, and at least one compound having a crystal structure other than the cubic crystal structure at normal temperature and normal pressure and under an equilibrium state and having mainly covalent bonding properties, said at least one nitride or carbonitride and said at least one compound being alternately laminated in the form of layers, each layer of said nitride or carbonitride and said compound having a thickness of 0.2–20 nm, said laminate having a cubic crystalline X-ray diffraction pattern as a whole.

2. A wear-resistant member comprising a hard or surface-hardened substrate made of a WC-based cemented carbide, a cement or a hard-speed steel and an ultra-thin film laminate having a thickness of 0.5 to 10 μm coated on the surface of said substrate, said ultra-thin laminate comprising at least one nitride or carbonitride of at least one element selected from the group consisting of the elements in the Groups IVa, Va and VIa in the Periodic Table and Al, said nitride or carbonitride having a cubic crystal structure and having mainly metallic bonding properties, and at least one nitride containing Al and/or B as main components and having a crystal structure other than the cubic crystal structure at normal temperature and normal pressure and under an equilibrium state and having mainly covalent bonding properties, said at least one nitride or carbonitride and said at least one nitride being alternately laminated in the form of layers, each layer of said nitride or carbonitride and said compound having a thickness of 0.2 to 20 nm, said laminate having a cubic crystalline X-ray diffraction pattern as a whole.

3. A wear resistant member as in claims 1 or 2 wherein the compositions of the adjacent compound layers change continuously.

4. A wear-resistant member as claimed in claim 1, 2 or 3 further comprising an intermediate layer provided between said substrate and said ultra-thin film laminate, said intermediate layer having a thickness of 0.05–5 μm and made of at least one compound selected from compounds comprising at least one element selected from the group consisting of the elements in the IVa, Va and VIa groups, compounds of at least one element selected from C and N, and oxides of elements in the IVa group.

5. A wear resistant member as claimed in claim 4, further comprising a surface layer provided on the surface of said ultra-thin film laminate, said surface layer having a thickness of 0.1–5 μm and made of at least one compound selected from nitrides, carbides, carbonitrides and oxides of elements in the IVa, Va and VIa groups.

6. A wear resistant member as claimed in any of claims 1, 2 or 3 which is used as a cutting tool such as a cutting insert, a drill and an end mill.

7. A wear resistant member as claimed in claim 6 in the form of a cutting insert having a rake face and a flank face both coated with said ultra-thin film laminate, said laminate formed on the rake face having a larger laminating cycle than said laminate formed on the flank face.

8. A wear resistant member as claimed in claim 6 in the form of a cutting insert having a rake face and a flank both coated with said ultra-thin film laminate, said laminate formed on the flank having a larger laminating cycle than said laminate formed on the rake face.

9. A wear resistant member wherein the ultra-thin film laminate as claimed in any of claims 1, 2 or 3 is used as a wear-resistant or protective layer of electric or electronic parts or sliding or machine parts, said ultra-thin film laminate having a thickness of 5 nm–10 μm.

* * * * *